US011914103B2

(12) United States Patent
Kim et al.

(10) Patent No.: US 11,914,103 B2
(45) Date of Patent: Feb. 27, 2024

(54) DISPLAY DEVICE

(71) Applicant: SAMSUNG DISPLAY CO., LTD., Yongin-si (KR)

(72) Inventors: Woongsik Kim, Hwaseong-si (KR); Jin-Su Byun, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 271 days.

(21) Appl. No.: 17/188,022

(22) Filed: Mar. 1, 2021

(65) Prior Publication Data

US 2021/0293993 A1 Sep. 23, 2021

(30) Foreign Application Priority Data

Mar. 17, 2020 (KR) .......... 10-2020-0032519

(51) Int. Cl.
*H10K 50/858* (2023.01)
*G02B 1/04* (2006.01)
*G02B 5/02* (2006.01)
*H10K 50/84* (2023.01)
*G06F 1/16* (2006.01)
*H10K 102/00* (2023.01)
*H10K 59/122* (2023.01)

(52) U.S. Cl.
CPC ............ *G02B 1/04* (2013.01); *G02B 5/0215* (2013.01); *H10K 50/84* (2023.02); *H10K 50/858* (2023.02); *G06F 1/1609* (2013.01); *H10K 59/122* (2023.02); *H10K 2102/00* (2023.02)

(58) Field of Classification Search
CPC ........ G02B 1/04; G02B 5/0215; H10K 50/84; H10K 50/858; H10K 59/122; H10K 2102/00
USPC ........................................................ 359/242
See application file for complete search history.

(56) References Cited

U.S. PATENT DOCUMENTS

| 9,318,726 | B2 | 4/2016 | Choi et al. |
| 9,406,724 | B2 | 8/2016 | Choi et al. |
| 10,224,377 | B2 | 3/2019 | Park et al. |
| 10,651,428 | B2 | 5/2020 | Jung et al. |
| 10,693,091 | B2 | 6/2020 | Kim. et al. |
| 10,707,447 | B2 | 7/2020 | Kim et al. |

(Continued)

FOREIGN PATENT DOCUMENTS

| JP | 2002-164180 | 6/2002 |
| JP | 3951893 | 6/2004 |

(Continued)

*Primary Examiner* — Ruiyun Zhang
(74) *Attorney, Agent, or Firm* — F. CHAU & ASSOCIATES, LLC

(57) ABSTRACT

A display device includes a first substrate, a first electrode disposed on the first substrate, an emission layer disposed on the first electrode, a second electrode disposed on the emission layer, a high refractive index member disposed on the second electrode, overlapping the emission layer, and having a first refractive index, a low refractive index member disposed between the high refractive index member and the emission layer and having a second refractive index smaller than the first refractive index, a capping member disposed between the low refractive index member and the emission layer, and a second substrate overlapping at least a portion of the first substrate and disposed on the high refractive index member.

15 Claims, 15 Drawing Sheets

(56) References Cited

U.S. PATENT DOCUMENTS

2018/0012940 A1\* 1/2018 Park .................. H10K 59/122
2019/0013495 A1\* 1/2019 Kim .................. H10K 59/123

FOREIGN PATENT DOCUMENTS

| KR | 10-1042707 | 6/2011 |
| KR | 10-2015-0004974 | 1/2015 |
| KR | 10-1560411 | 10/2015 |
| KR | 10-2019-0087689 | 7/2019 |

\* cited by examiner

DISPLAY DEVICE

CROSS-REFERENCE TO RELATED APPLICATION(S)

This application claims priority from and the benefit of Korean Patent Application No. 10-2020-0032519, filed on Mar. 17, 2020, which is hereby incorporated by reference for all purposes as if fully set forth herein.

TECHNICAL FIELD

The present disclosure relates generally to a display device. More particularly, embodiments of the present disclosure relate to a display device with increased emission efficiency.

DISCUSSION OF THE RELATED ART

Display devices may include an emission element that emits light and an upper structure disposed on the emission element. For example, the upper structure may be an encapsulation substrate, a polarizing plate, or a window. The emission element emits light at various angles, and a user can visually recognize the light passing through the upper structure in a vertical direction of the upper structure. In some display devices, light may leave the display at an angle where a user can't see it. This may result in a less efficient display.

Additionally, in some display devices, layers above the emission layer may offgas material back towards the emission layer. This causes degradation of the emission layer, and reduces reliability of the display device.

The above information disclosed in this Background section is only for understanding of the background of the inventive concepts, and, therefore, it may contain information that does not constitute prior art.

SUMMARY

Display devices constructed according to the principles and example implementations of the invention may provide a display device with increased emission efficiency. Additional features of the inventive concepts will be set forth in the description which follows, and in part will be apparent from the description, or may be learned by practice of the inventive concepts.

A display device according to an example embodiment may include a first substrate, a first electrode disposed on the first substrate, an emission layer disposed on the first electrode, a second electrode disposed on the emission layer, a high refractive index member disposed on the second electrode, overlapping the emission layer, and having a first refractive index, a low refractive index member disposed between the high refractive index member and the emission layer and having a second refractive index smaller than the first refractive index, a capping member disposed between the low refractive index member and the emission layer, and a second substrate overlapping at least a portion of the first substrate and disposed on the high refractive index member.

According to an example embodiment, the high refractive index member may have a refractive index between 1.5 and 1.6, and the second substrate may have a refractive index between 1.5 and 1.6.

According to an example embodiment, the high refractive index member may include a first surface, a second surface, and a side surface. The first surface may contact the second substrate along a vertical direction. The second surface may be opposite to the first side and may have a second length smaller than a first length of the first surface, and the side surface may connect the first surface and the second surface.

According to an example embodiment, the low refractive index member may contact the second surface and the side surface.

According to an example embodiment, the low refractive index member may overlap the emission layer.

According to an example embodiment, the emission layer may overlap the second surface and the side surface.

According to an example embodiment, a length of the emission layer may be smaller than the first length of the first surface and greater than the second length of the second surface.

According to an example embodiment, the display device may further include a plurality of auxiliary members disposed on the second electrode and not overlapping the emission layer.

According to an example embodiment, a shape of each of the auxiliary members may be the same as a shape of the high refractive index member.

According to an example embodiment, the auxiliary members may include a same material as the high refractive index member.

According to an example embodiment, a size of each of the auxiliary members may be smaller than a size of the high refractive index member.

According to an example embodiment, the high refractive index member may include an organic material.

According to an example embodiment, the high refractive index member may include a siloxane-based resin.

According to an example embodiment, the capping member may include an inorganic material.

A display device according to another example embodiment may include a first substrate, a first electrode disposed on the first substrate, an emission layer disposed on the first electrode, a second electrode disposed on the emission layer, a low refractive index member disposed on the second electrode and having a first refractive index, a high refractive index member disposed between the low refractive index member and the emission layer and having a second refractive index greater than the first refractive index, and a second substrate overlapping at least a portion of the first substrate and disposed on the low refractive index member. The low refractive index member may include a first surface contacting the second substrate, a second surface opposing to the first side and having a second length greater than a first length of the first surface, and a side surface connecting the first substrate and the second substrate.

According to an example embodiment, the high refractive index member may contact the second surface and the side surface.

According to an example embodiment, the low refractive index member may overlap the emission layer.

According to an example embodiment, the display device may further include a capping member disposed between the high refractive index member and the emission layer.

According to an example embodiment, the low refractive index member may have a refractive index between 1.5 and 1.6, and the second substrate may have a refractive index between 1.5 and 1.6.

A display device according to still another example embodiment may include a first substrate, a first electrode disposed on the first substrate, an emission layer disposed on the first electrode, a second electrode disposed on the emission layer, a high refractive index member disposed on the second electrode, overlapping the emission layer, and having a refractive index between 1.5 and 1.6, a low refractive index member disposed between the high refractive index member and the emission layer and having a refractive index between 1 and 1.4, and a second substrate overlapping at least a portion of the first substrate and disposed on the high refractive index member, having a refractive index between 1.5 and 1.6. The high refractive index member may include a first surface contacting the second substrate, a second surface opposing to the first side and having a second length smaller than a first length of the first surface, and a side surface connecting the first substrate and the second substrate, and the side surface may have an angle between 60 degrees and 75 degrees with respect to the first surface.

Therefore, since the display device according to example embodiments includes the refractive layer disposed on the emission layer, the light emitted from the emission layer may be directed and pass through the second substrate in a vertical direction of the second substrate. Therefore, the emission efficiency of the display device may be increased. In addition, since the refractive layer includes the high refractive index member, the low refractive index member surrounding the high refractive index member, and the capping member surrounding the high refractive index member, outgassing of the organic material included in the high refractive index member may be prevented. Accordingly, the emission layer is less prone to damage, and the display device is more reliable.

It is to be understood that both the foregoing general description and the following detailed description are for example and explanatory purposes and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention, and together with the description serve to explain the inventive concepts.

DETAILED DESCRIPTION

The present disclosure relates to a display device. Some embodiments of the present disclosure comprise a display device with an emission layer, a low refractive index layer, and a high refractive index layer. The arrangement of these layers may allow light to be directed in a substantially vertical direction out of the display panel. This may result in a more energy efficient display.

Conventional display devices may contain emission elements that produce light radially. Additionally, the conventional display devices may not have systems or methods for capturing and directing the light from their emission elements. This may result in light that leaves the display panel in multiple directions, decreasing the overall efficiency of the light.

In embodiments of the present disclosure, light from the emission layer may be refracted at a first point along a boundary between the low refractive index member and the high refractive index member. The light may then reach a side surface of the high refractive index member, and reflect in a substantially vertical direction out of the display panel. This process may increase the effective transmission of light, and increase the efficiency of the display.

Additionally or alternatively, some embodiments comprise a capping member, which may be disposed between the emission layer and the low refractive index layer. In some cases, the low refractive index layer contains an organic material, that may offgas material.

Illustrative, non-limiting embodiments will be more clearly understood from the following detailed description in conjunction with the accompanying drawings.

Figure 1:
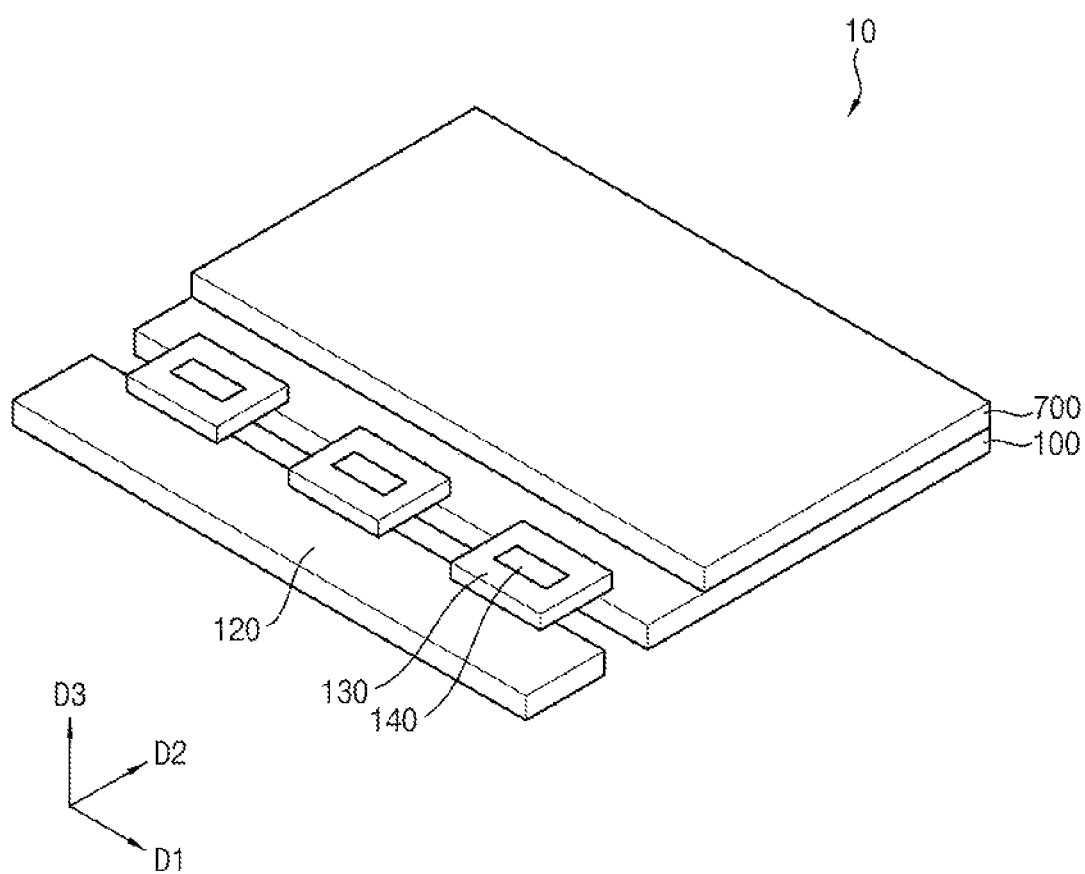
FIG. 1 is a perspective view illustrating a display device according to example embodiments.
Figure 2:
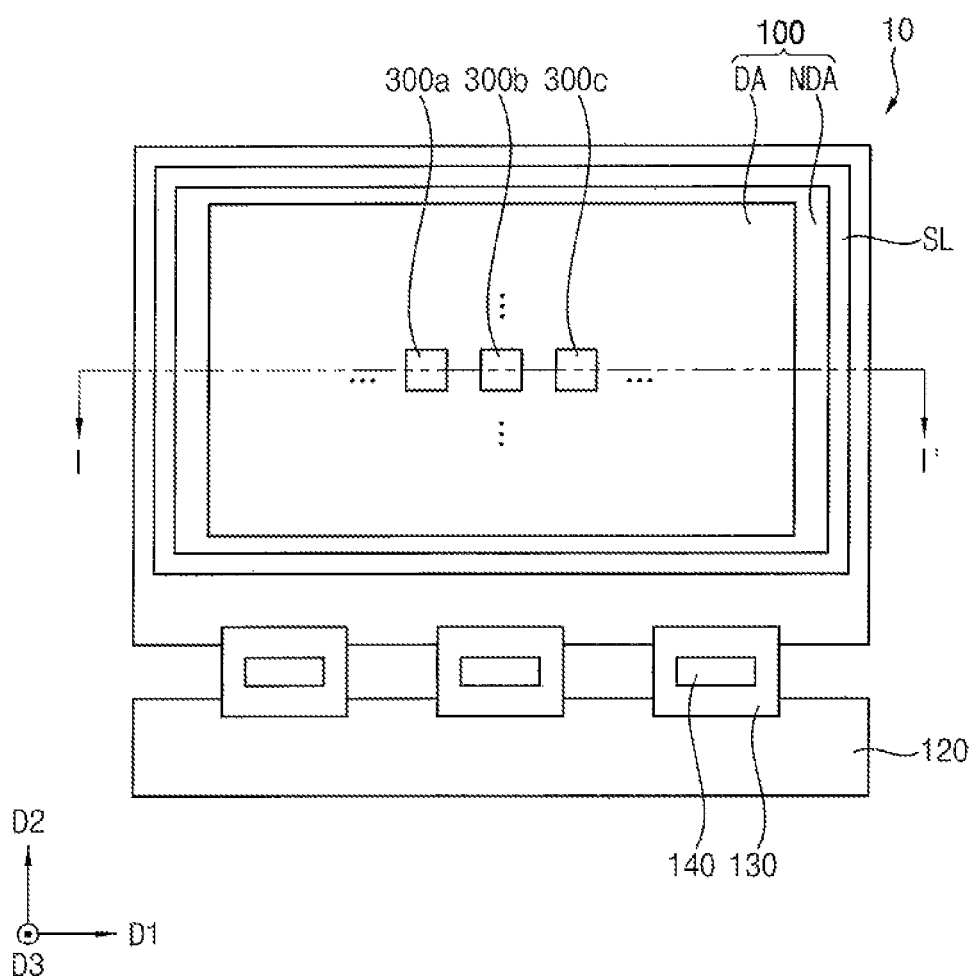
FIG. 2 is a plan view illustrating the display device of FIG. 1.

FIG. 1 is a perspective view illustrating a display device according to example embodiments. FIG. 2 is a plan view illustrating the display device of FIG. 1.

Referring to FIGS. 1 and 2, a display device 10 according to example embodiments may include a first substrate 100, a second substrate 700, a printed circuit board 120, a flexible film 130, and a data driver 140.

The first substrate 100 may include a display area DA and a non-display area NDA. An image may be displayed in the display area DA, and the non-display area NDA may surround the display area DA on a plane.

A plurality of emission elements 300a, 300b, and 300c may be disposed in the display area DA. The emission elements 300a, 300b, and 300c may be disposed to be spaced apart from each other by a predetermined distance. For example, the emission elements 300a, 300b, and 300c may include a first emission element 300a, a second emission element 300b, and a third emission element 300c. The first to third emission elements 300a, 300b, and 300c may be disposed along a first direction D1. The first emission element 300a may emit red light, the second emission element 300b may emit green light, and the third emission element 300c may emit blue light.

In addition, gate lines and data lines for driving the emission elements 300a, 300b, and 300c may be further disposed in the display area DA. For example, the gate lines may extend along the first direction D1, and the data lines may extend along a second direction D2 orthogonal to the first direction D1. The emission elements 300a, 300b, and 300c may be formed in regions where the gate lines and the data lines cross.

A gate driver and a pad may be disposed in the non-display area NDA.

The gate driver may provide a gate signal through the gate lines. For example, the gate driver may include a plurality of transistors, and may be mounted on one or both sides of the non-display area NDA.

The data driver 140 may provide a data voltage through the data lines. For example, the data driver 140 may comprise a driver chip, and may be mounted on the flexible film 130 in a chip-on-film ("COF") structure.

A plurality of circuits comprising driving chips may be mounted on the printed circuit board 120. For example, a timing controller may be mounted on the printed circuit board 120. The timing controller may control the gate driver and the data driver 140.

The printed circuit board 120 may be attached to the flexible film 130, and may be electrically connected to the first substrate 100 through the flexible film 130. For example, the printed circuit board 120 may be a printed circuit board ("PCB") or a flexible printed circuit board ("FPCB").

The flexible film 130 may electrically connect the pad and the printed circuit board 120. For example, the flexible film 130 may be attached to the pad and the printed circuit board using an anisotropic conducting film ("ACF"). A plurality of lines may be disposed on the flexible film 130, and the printed circuit board 120 may be electrically connected to the pad through the lines.

In addition, a sealing member SL may be disposed in the non-display area NDA. The sealing member SL may be disposed to surround the display area DA on a plane, and the first substrate 100 may be bonded to the second substrate 700 through the sealing member SL. In addition, the sealing member SL may prevent foreign matter or moisture from penetrating into the display device 10 from the outside.

The second substrate 700 may face the first substrate 100. For example, the second substrate 700 may be an encapsulation substrate. For example, the first substrate 100 may be a glass substrate, a plastic substrate, or the like, and the second substrate 700 may be a glass substrate, a plastic substrate, an encapsulation film, or the like.

The second substrate 700 may include a same material as the first substrate 100. For example, the first and second substrates 100 and 700 may be glass substrates. In addition, the second substrate 700 may have a rectangular shape that is substantially the same as a shape of the first substrate 100. In addition, the second substrate 700 may have an area smaller than an area of the first substrate 100, and thus, a part of the first substrate 100 may not be covered by the second substrate 700. However, materials, shapes, and areas of the first and second substrates 100 and 700 are not limited thereto.

Figure 3:
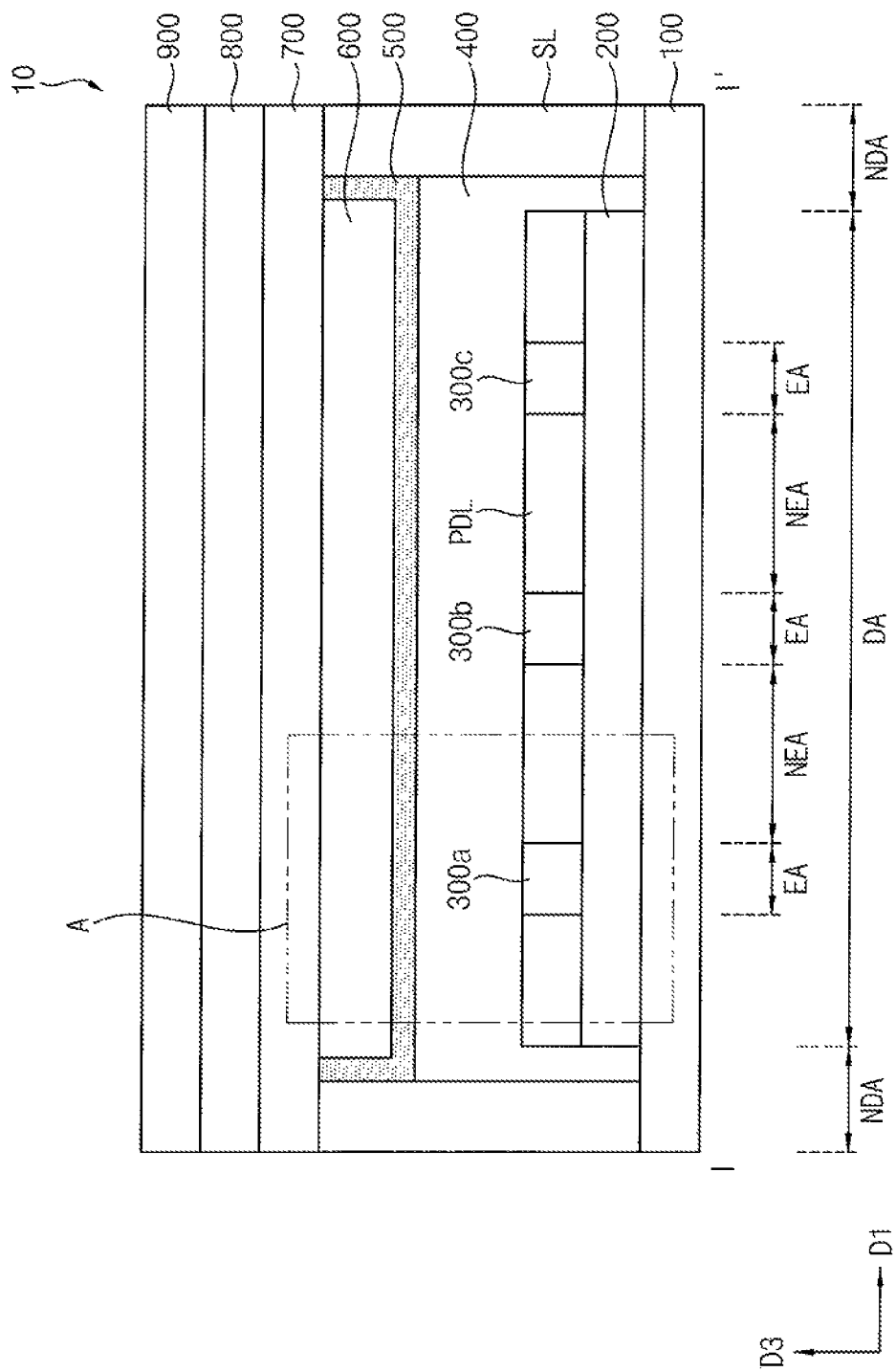
FIG. 3 is a cross-section view illustrating the display device of FIG. 1.
Figure 4:
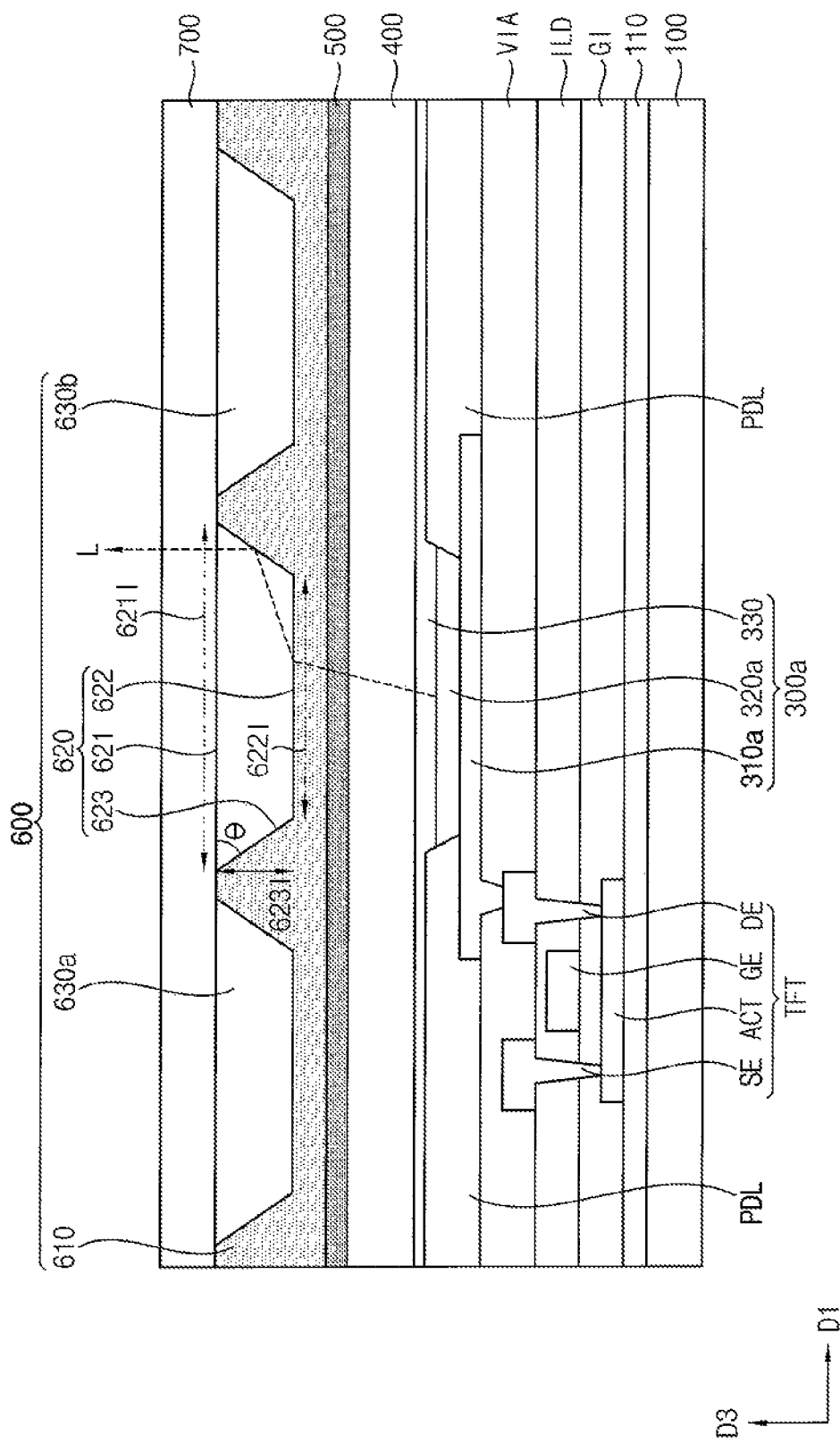
FIG. 4 is a cross-section view illustrating an example of a refractive layer included in the display device of FIG. 3.

FIG. 3 is a cross-section view illustrating the display device of FIG. 1. FIG. 4 is a cross-section view illustrating an example of a refractive layer included in the display device of FIG. 3. For example, FIG. 4 may be an enlarged view of area A of FIG. 3.

Referring to FIGS. 3 and 4, the display device 10 may include the first substrate 100, a driving element layer 200, an emission element layer, a filling layer 400, the sealing member SL, a capping member 500, and a refractive layer 600, the second substrate 700, a functional layer 800, and a window 900. The emission element layer may include the emission elements 300a, 300b, and 300c and a pixel defining layer PDL. The refractive layer 600 may include a low refractive index member 610, a high refractive index member 620, a first auxiliary member 630a, and a second auxiliary member 630b.

A buffer layer 110 may be disposed on the first substrate 100. The buffer layer 110 may prevent diffusion of metal atoms or impurities from the first substrate 100 to the driving element layer 200. In addition, the buffer layer 110 may uniformly form the driving element layer 200 by controlling a heat transfer rate during a crystallization process for forming the driving element layer 200.

The driving element layer 200 may drive the emission element layer by receiving the gate signal and the data voltage. For example, the driving element layer 200 may include a thin film transistor TFT and a plurality of insulating layers. The thin film transistor TFT may include an active pattern ACT, a gate electrode GE, a source electrode SE, and a drain electrode DE. The insulating layers may include a gate insulating layer GI, an interlayer insulating layer ILD, and a via insulating layer VIA.

The active pattern ACT may be disposed on the buffer layer 110. For example, the active pattern ACT may include a silicon semiconductor or an oxide semiconductor. For example, the silicon semiconductor may include amorphous silicon, polycrystalline silicon, or the like. The active pattern ACT may include a source region, a drain region, and a channel region positioned between the source region and the drain region. Ions may be implanted into the source and drain regions.

The gate insulating layer GI may cover the active pattern ACT and may be disposed on the buffer layer 110. The gate insulating layer GI may include an insulating material. In an example embodiment, the gate insulating layer GI may have a substantially flat top surface. In another example embodiment, the gate insulating layer GI may have a same thickness and may be disposed along a profile of the active pattern ACT. In some examples, the gate insulating layer GI may include silicon oxide, silicon nitride, titanium oxide, tantalum oxide, or the like.

The gate electrode GE may be disposed on the gate insulating layer GI. The gate electrode GE may overlap the channel region of the active pattern ACT. The gate signal may be provided to the gate electrode GE, and the thin film transistor TFT may be turned on or off in response to the gate signal.

The interlayer insulating layer ILD may cover the gate electrode GE and may be disposed on the gate insulating layer GI. The interlayer insulating layer ILD may include an insulating material. In an example embodiment, the interlayer insulating layer ILD may have a substantially flat top surface. In another example embodiment, the interlayer insulating layer ILD may have a same thickness and may be disposed along the profile of the gate electrode GE.

The source electrode SE and the drain electrode DE may be disposed on the interlayer insulating layer ILD. The source electrode SE may contact the source region of the active pattern ACT, and the drain electrode DE may contact the drain region of the active pattern ACT. For example, a voltage for driving the emission elements 300a, 300b, and 300c may be provided to the source electrode SE and then transmitted to the drain electrode DE through the active pattern ACT.

The via insulating layer VIA may cover the source electrode SE and the drain electrode DE, and may be disposed on the interlayer insulating layer ILD. The via insulating layer VIA may include an insulating material. In an example embodiment, the via insulating layer VIA may have a substantially flat top surface. For example, the via insulating layer VIA may include a photoresist, a polyacryl resin, a polyimide resin, an acryl resin, or the like. In another example embodiment, the via insulating layer VIA may have a same thickness and may be disposed along profiles of the source and drain electrodes SE and DE.

Each of the emission elements 300a, 300b, and 300c may include a first electrode, an emission layer, and a second electrode. For example, the first emission element 300a may include a first electrode 310a, a first emission layer 320a, and a second electrode 330. The second emission element 300b may include a first electrode, a second emission layer, and the second electrode 330. The third emission element 300c may include a first electrode, a third emission layer, and the second electrode 330. The first electrodes of the first to third emission elements 300a, 300b, and 300c may be spaced apart from each other.

The first electrode 310a may be disposed on the via insulating layer VIA. The first electrode 310a may contact the drain electrode DE through a contact hole formed by removing a part of the via insulating layer VIA. The first electrode 310a may include a metal, an alloy, or a conductive metal oxide. For example, the first electrode 310a may include gold ("Au"), silver ("Ag"), copper ("Cu"), nickel ("Ni"), chromium ("Cr"), aluminum ("Al"), tungsten ("W"), molybdenum ("Mo"), titanium ("Ti"), tantalum ("Ta"), indium tin oxide ("ITO"), indium zinc oxide ("IZO"), and alloys thereof. In an example embodiment, the first electrode 310a may be a reflective electrode. For example, the first electrode 310a may include silver ("Ag"), an alloy containing silver, aluminum ("Al"), copper ("Cu"), platinum ("Pt"), and the like.

The pixel defining layer PDL may be disposed on the via insulating layer VIA. For example, the pixel defining layer PDL may include an opening exposing a portion of an upper surface of the first electrode 310a. An emission layer within the emission layers may be disposed in the opening. Accordingly, the pixel defining layer PDL may define regions in which the emission layers are disposed. In addition, the pixel defining layer PDL may function as a light blocking member. For example, the pixel defining layer PDL may include a black pigment or a black dye.

As described above, an emission layer within the first to third emission layers may be disposed in the opening. For example, the first emission layer 320a may be disposed in a first opening, the second emission layer may be disposed in a second opening spaced apart from the first opening, and the third emission layer may be disposed in a third opening spaced apart from the first and second openings.

In an example embodiment, the display area DA may include an emission area EA and a non-emission area NEA. The emission area EA may be areas in which the emission layers are disposed. For example, the emission area EA may include an area in which the first emission layer 320a is disposed. In other words, the emission area EA may include an area in which an upper surface of the first electrode 310a is exposed by the opening. The non-emission area NEA may be areas in which the emission layers are not disposed. In other words, the non-emission area NEA may be areas in which the pixel defining layer PDL remains.

The second electrode 330 may be disposed on the emission layers and the pixel defining layer PDL. The second electrode 330 may include a metal, an alloy, or a conductive metal oxide. For example, the second electrode 330 is gold ("Au"), silver ("Ag"), copper ("Cu"), nickel ("Ni"), chromium ("Cr"), aluminum ("Al"), tungsten ("W"), molybdenum ("Mo"), titanium ("Ti"), tantalum ("Ta"), indium tin oxide ("ITO"), indium zinc oxide ("IZO"), and alloys thereof. In an example embodiment, the second electrode 330 may be transparent. For example, the second electrode 330 may include nickel ("Ni"), chromium ("Cr"), titanium ("Ti"), indium tin oxide ("ITO"), indium zinc oxide ("IZO"), and the like.

The filling layer 400 may be disposed on the second electrode 330. A filler may be filled inside the filling layer 400. For example, the filler may be air, an organic polymer, or resin. The filling layer 400 may increase high temperature stability and shock absorption of the display device 10.

The sealing member SL may be disposed in the non-display area NDA. For example, one surface of the sealing member SL may be attached to the first substrate 100, and the other surface of the sealing member SL may be attached to the second substrate 700. The sealing member SL may prevent leakage of the filler. In addition, the sealing member SL may prevent foreign matter or moisture from penetrating into the display device 10 from the outside.

The capping member 500 may be disposed to surround the refractive layer 600. In an example embodiment, after the refractive layer 600 is formed under the second substrate 700, the capping member 500 may be formed on side surfaces and lower surfaces of the refractive layer 600. In an example embodiment, the capping member 500 may include an inorganic material such as silicon nitride ("SiNx") and silicon oxide ("SiOx"). In another example embodiment, the capping member 500 may include an organic metal complex such as Alq3.

The capping member 500 may prevent leakage of the low refractive index member 610 of the refractive layer 600. In addition, the capping member 500 may induce a constructive interference of light, thereby increasing emission efficiency of the display device 10. In addition, the capping member 500 may prevent outgassing of organic materials included in the high refractive index member 620, the first auxiliary member 630a and the second auxiliary member 630b.

The low refractive index member 610 may be disposed on the capping member 500 and may be supported by the capping member 500. In addition, the low refractive index member 610 may be disposed to surround the high refractive index member 620, the first auxiliary member 630a and the second auxiliary member 630b. In an example embodiment, the low refractive index member 610 may be entirely disposed inside a space defined by the capping member 500. For example, the low refractive index member 610 may overlap the first emission layer 320a. In another example embodiment, the low refractive index member 610 may be selectively disposed inside the space defined by the capping member 500. For example, the low refractive index member 610 may overlap the pixel defining layer PDL and may not overlap the first emission layer 320a.

The low refractive index member 610 may include a low refractive index material. In an example embodiment, the low refractive index member 610 may include air. In another example embodiment, the low refractive index member 610 may include an organic material or an inorganic material. In this example, the low refractive index member 610 may prevent outgassing of organic materials included in the high refractive index member 620, the first auxiliary member 630a, and the second auxiliary member 630b.

The high refractive index member 620 may be disposed on the low refractive index member 610 and may be covered by the low refractive index member 610. In addition, the high refractive index member 620 may contact a lower surface of the second substrate 700. The high refractive index member 620 may overlap each of the emission layers. For example, the high refractive index member 620 may overlap the first emission layer 320a.

In an example embodiment, the high refractive index member 620 may include a first surface 621 contacting the second substrate 700, a second surface 622 opposite to the first surface 621 and having a second length 622I smaller than a first length 621I of the first surface 621, and a side surface 623 connecting the first surface 621 and the second surface 622. Accordingly, a cross section of the high refractive index member 620 may have an inverted trapezoid shape. In this example, the low refractive index member 610 may contact the second surface 622 and the side surfaces 623 to surround the high refractive index member 620.

In an example embodiment, the high refractive index member 620 may direct light coming from the emission layers through a refraction process. Light may travel through the low refractive index member 610 to a boundary portion that interfaces with high refractive index member 620. At the boundary, the light may bend within the high refractive index member 620 to the side surface 623. At side surface 623, light may reflect towards a vertical direction D3 through the second substrate 700. Refraction off of the boundary between the low refractive index member 610 and the high refractive index member 620, and the subsequent reflection off the boundary between the high refractive index member 620 and low refractive index member 610 may increase the efficiency of emitted light from the display.

In an example embodiment, the first emission layer 320*a* may overlap the second surface 622 and the side surface 623 of the high refractive index member 620. For example, a length of the first emission layer 320*a* may be smaller than the first length 621I of the first surface 621 and greater than the second length 622I of the second surface 622. Accordingly, since the high refractive index member 620 may refract light emitted from an edge of the first emission layer 320*a*, the emission efficiency of the display device 10 may be further increased.

In an example embodiment, the high refractive index member 620 may include an organic material. In addition, the high refractive index member 620 may include a curable material. For example, the high refractive index member 620 may include a siloxane-based resin, a polyimide-based resin, a photoresist, an acrylic resin, a methacryl-based resin, an acrylate-based resin, a methacrylate-based resin, a vinyl-based resin, an epoxy-based resin, a urethane-based resin, a polyamide-based resin, and the like.

The first and second auxiliary members 630*a* and 630*b* may be disposed to surround the high refractive index member 620 on a plane. In an example embodiment, the shapes of the first and second auxiliary members 630*a* and 630*b* may be the same as the shape of the high refractive index member 620.

For example, the first auxiliary member 630*a* may have an inverted trapezoid shape, and may be disposed to be spaced apart from the high refractive index member 620 by a predetermined distance. The second auxiliary member 630*b* may have an inverted trapezoid shape, and may be disposed to be spaced apart from the high refractive index member 620 and the first auxiliary member 630*a* by a predetermined distance.

In an example embodiment, the first and second auxiliary members 630*a* and 630*b* may be formed together with the high refractive index member 620. Accordingly, the first and second auxiliary members 630*a* and 630*b* may include a same material as the high refractive index member 620. Since the display device 10 further includes the first and second auxiliary members 630*a* and 630*b* capable of refracting light emitted from the first emission layer 320*a*, the emission efficiency may be further increased.

When layers in a display device contain an organic material, outgassing may occur. For example, when carbon contained in the high refractive index member 620 is exposed to oxygen existing outside the high refractive index member 620, the carbon may be combined with the oxygen and may leave the high refractive index member 620 in the form of a gas (e.g., $CO_2$). When the gas formed by the outgassing reaches the emission elements 300*a*, 300*b*, and 300*c*, the emission elements 300*a*, 300*b*, and 300*c* may be damaged.

However, since the low refractive index member 610 and the capping member 500 are disposed to surround the high refractive index member 620, the gas may not reach the emission elements 300*a*, 300*b*, and 300*c*. Accordingly, the display device 10 may prevent damage to the emission elements 300*a*, 300*b*, and 300*c* due to the outgassing.

The second substrate 700 may be disposed on the refractive layer 600. For example, after the refractive layer 600 is formed on a lower surface of the second substrate 700, the second substrate 700 may be joined with the first substrate 100.

The functional layer 800 may be disposed on the second substrate 700. For example, the functional layer 800 may include a polarizing layer, a sensing panel, and a planarization layer. The polarizing layer may polarize light and block external light to increase visibility of the display device 10. The sensing panel may sense a user's touch and/or approach, and may provide for the display device 10 to display an image according to the user's manipulation. The planarization layer may have a substantially flat top surface, and may compensate for an overall height of the display device 10.

The window 900 may be disposed on the functional layer 800. The window 900 may include glass or plastic, and may protect the display device 10 from external impact.

In an example embodiment, the high refractive index member 620 may have a first refractive index, and the low refractive index member 610 may have a second refractive index smaller than the first refractive index. For example, the high refractive index member 620 may have a refractive index between 1.5 and 1.6, and the low refractive index member 610 may have a refractive index between 1 and 1.4. The second substrate 700 may have a refractive index between 1.5 and 1.6. In an example embodiment, the refractive index of the second substrate 700 may be the same as the first refractive index of the high refractive index member 620.

Accordingly, a light L emitted from the first emission layer 320*a* may be emitted to the outside through the capping member 500, the low refractive index member 610, and the high refractive index member 620. In this example, the light L may be refracted by the capping member 500, the low refractive index member 610, and the high refractive index member 620, and may pass through the second substrate 700 in a vertical direction (e.g., a third direction D3) of the second substrate 700. Therefore, the emission efficiency of the display device 10 may be increased.

In an example embodiment, the first surface 621 may have the first length 621I between 7 um and 11 um, and the second surface 622 may have the second length 622I between 3 um and 3 um. In addition, the side surface 623 may have a thickness 623I between 2 um and 3 um, and may have an angle θ between 60 degrees and 75 degrees with respect to the first surface 621.

Figure 5:
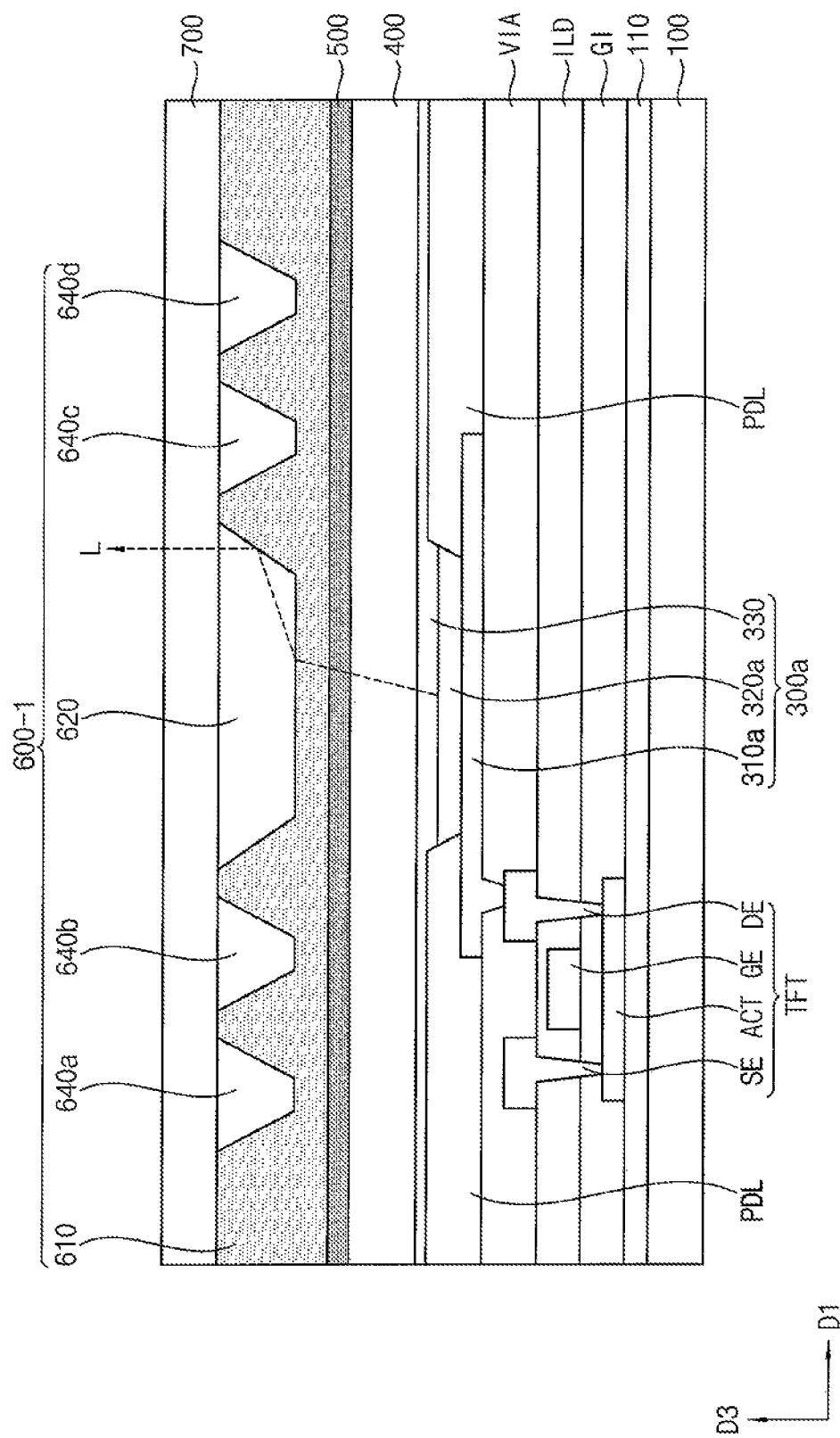
FIG. 5 is a cross-section view illustrating another example of a refractive layer included in the display device of FIG. 3.

FIG. 5 is a cross-section view illustrating another example of a refractive layer included in the display device of FIG. 3. For example, FIG. 5 may be an enlarged view of area A of FIG. 3.

Referring to FIGS. 3 and 5, the display device 10 may include the first substrate 100, the driving element layer 200, the emission element layer, the filling layer 400, the sealing member SL, the capping member 500, and a refractive layer 600-1, the second substrate 700, the functional layer 800, and the window 900. However, since the first substrate 100, the driving element layer 200, the emission element layer, the filling layer 400, the sealing member SL, the capping member 500, and the second substrate 700, the functional layer 800, and the window 900 are substantially same as the first substrate 100, the driving element layer 200, the emission element layer, the filling layer 400, the sealing member SL, the capping member 500, and the second substrate 700, the functional layer 800, and the window 900 described with reference to FIGS. 3 and 4, the refractive layer 600-1 will be described below.

The refractive layer 600-1 may include the low refractive index member 610, the high refractive index member 620, a first auxiliary member 640a, a second auxiliary member 640b, a third auxiliary member 640c, and a fourth auxiliary member 640d.

The first to fourth auxiliary members 640a, 640b, 640c, and 640d may be disposed to surround the high refractive index member 620 on a plane. In an example embodiment, each shape of the first to fourth auxiliary members 640a, 640b, 640c, and 640d may be the same as the shape of the high refractive index member 620.

For example, the first auxiliary member 640a may have an inverted trapezoid shape, and may be disposed to be spaced apart from the high refractive index member 620 by a predetermined distance. The second auxiliary member 640b may have an inverted trapezoid shape, and may be disposed between the high refractive index member 620 and the first auxiliary member 640a. The third auxiliary member 640c may have an inverse trapezoid shape, and may be disposed between the high refractive index member 620 and the fourth auxiliary member 640d. The fourth auxiliary member 640d may have an inverted trapezoid shape, and may be disposed to be spaced apart from the high refractive index member 620 by a predetermined distance.

In an example embodiment, the first to fourth auxiliary members 640a, 640b, 640c, and 640d may be formed together with the high refractive index member 620. Accordingly, the first to fourth auxiliary members 640a, 640b, 640c, and 640d may include a same material as the high refractive index member 620.

In an example embodiment, a size of each of the first to fourth auxiliary members 640a, 640b, 640c, and 640d may be smaller than a size of the high refractive index member 620.

Since the display device 10 further includes the first to fourth auxiliary members 640a, 640b, 640c, 640d capable of refracting light emitted from the first emission layer 320a, the emission efficiency of the display device 10 may be further increased.

Figure 6:
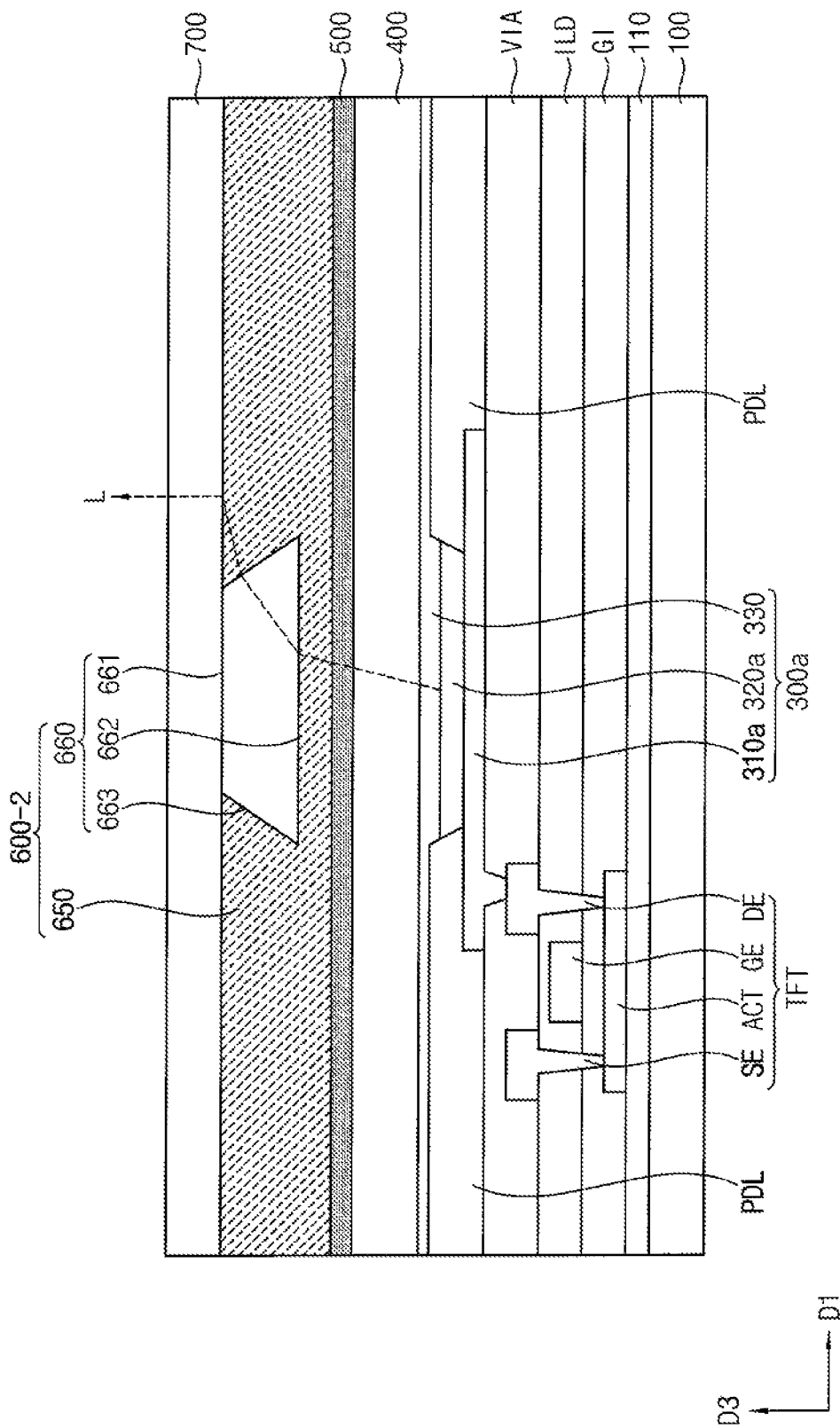
FIG. 6 is a cross-section view illustrating still another example of a refractive layer included in the display device of FIG. 3.

FIG. 6 is a cross-section view illustrating still another example of a refractive layer included in the display device of FIG. 3. For example, FIG. 6 may be an enlarged view of area A of FIG. 3.

Referring to FIGS. 3 and 6, the display device 10 may include the first substrate 100, the driving element layer 200, the emission element layer, the filling layer 400, the sealing member SL, the capping member 500, and a refractive layer 600-2, the second substrate 700, the functional layer 800, and the window 900. However, since the first substrate 100, the driving element layer 200, the emission element layer, the filling layer 400, the sealing member SL, the capping member 500, and the second substrate 700, the functional layer 800, and the window 900 are substantially same as the first substrate 100, the driving element layer 200, the emission element layer, the filling layer 400, the sealing member SL, the capping member 500, and the second substrate 700, the functional layer 800, and the window 900 described with reference to FIGS. 3 and 4, the refractive layer 600-2 will be described below.

The refractive layer 600-2 may include a high refractive index member 650 and a low refractive index member 660.

The high refractive index member 650 may be disposed on the capping member 500 and may be supported by the capping member 500. In addition, the high refractive index member 650 may be disposed to surround the low refractive index member 660. In an example embodiment, the high refractive index member 650 may be entirely disposed inside a space defined by the capping member 500. For example, the high refractive index member 650 may overlap the emission elements 300a, 300b, and 300c and the pixel defining layer PDL. In another example embodiment, the high refractive index member 650 may be selectively disposed inside the space defined by the capping member 500. For example, the high refractive index member 650 may overlap the pixel defining layer PDL and may not overlap the emission elements 300a, 300b, and 300c.

The low refractive index member 660 may be disposed on the high refractive index member 650 and may be covered by the high refractive index member 650. In addition, the low refractive index member 660 may contact a lower surface of the second substrate 700. The low refractive index member 660 may overlap each of the emission elements 300a, 300b, and 300c.

In an example embodiment, the low refractive index member 660 may include a first surface 661 contacting the second substrate 700, a second surface 662 opposite to the first surface 661 and having a second length greater than a first length of the first surface 661, and a side surface 663 connecting the first surface 661 and the second surface 662. Accordingly, a cross section of the low refractive index member 660 may have a trapezoidal shape. In this example, the high refractive index member 650 may contact the second surface 662 and the side surface 663 to surround the low refractive index member 660.

In an example embodiment, the high refractive index member 650 may include a high refractive index material. For example, the high refractive index member 650 may include polyvinyl chloride, polychloro styrene, polydichloro styrene, polyphenylmethyl silane, and polysulfone resin, polystyrene sulfide, phenol formaldehyde resin, etc.

In an example embodiment, the low refractive index member 660 may include an organic material. In addition, the low refractive index member 660 may include a curable material. For example, the low refractive index member 660 may include a siloxane resin, a polyimide resin, a photoresist, an acrylic resin, a methacryl resin, an acrylate-based resin, a methacrylate-based resin, a vinyl-based resin, an epoxy-based resin, a urethane-based resin, a polyamide-based resin, and the like. In an example embodiment, the low refractive index member 660 may include the substantially same material as the high refractive index member 620 described with reference to FIG. 4.

In an example embodiment, the low refractive index member 660 may have a first refractive index, and the high refractive index member 650 may have a second refractive index greater than the first refractive index. For example, the low refractive index member 660 may have a refractive index between 1.5 and 1.6, and the high refractive index member 650 may have a refractive index between 1.6 and 1.7. The second substrate 700 may have a refractive index between 1.5 and 1.6. In an example embodiment, the refractive index of the second substrate 700 may be the same as the first refractive index of the low refractive index member 660.

Accordingly, a light L emitted from the first emission layer 320a may be emitted to the outside through the capping member 500, the high refractive index member 650, and the low refractive index member 660. In this example, the light L may be refracted by the capping member 500, the high refractive index member 650, and the low refractive index member 660, and may pass through the second substrate 700 in a vertical direction (e.g., the third direction D3) of the second substrate 700. Therefore, the emission efficiency of the display device 10 may be increased.

FIGS. 7 to 11 are cross-section views illustrating a method of manufacturing the display device including the refractive layer of FIG. 4.

Figure 7:
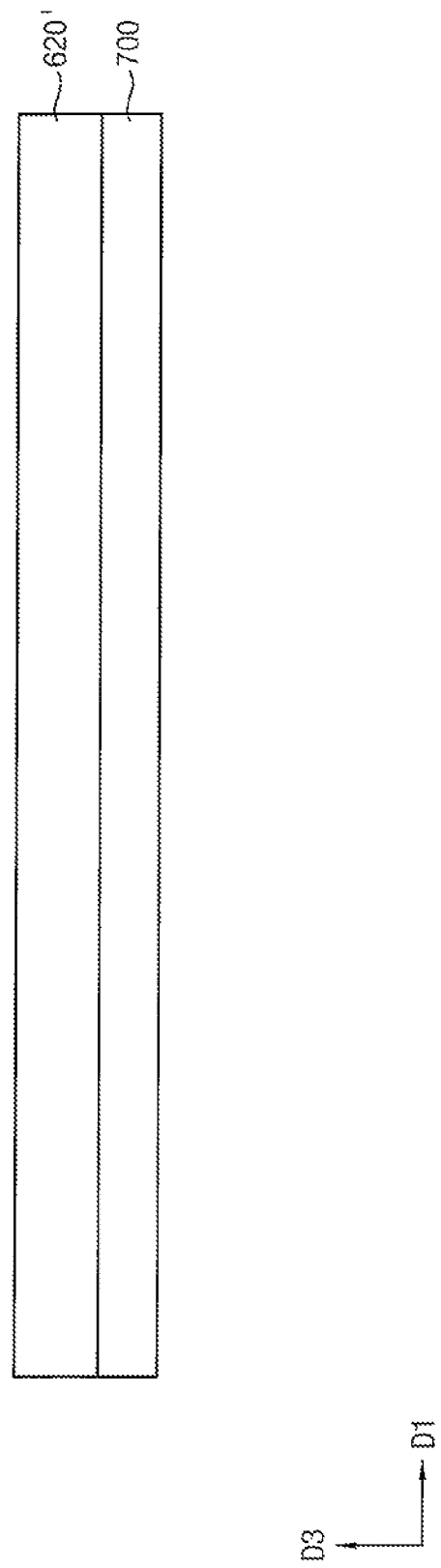
FIGS. 7 to 11 are cross-section views illustrating a method of manufacturing the display device including the refractive layer of FIG. 4.

Referring to FIGS. 3, 4, and 7, a high refractive index layer 620' may be formed on the second substrate 700. The high refractive index member 620' may include an organic material. In addition, the high refractive index member 620' may include a curable material. For example, the high refractive index member 620' may include a siloxane resin, a polyimide resin, a photoresist, an acrylic resin, a methacryl resin, an acrylate-based resin, a methacrylate-based resin, a vinyl-based resin, an epoxy-based resin, a urethane-based resin, a polyamide-based resin, and the like.

Figure 8:
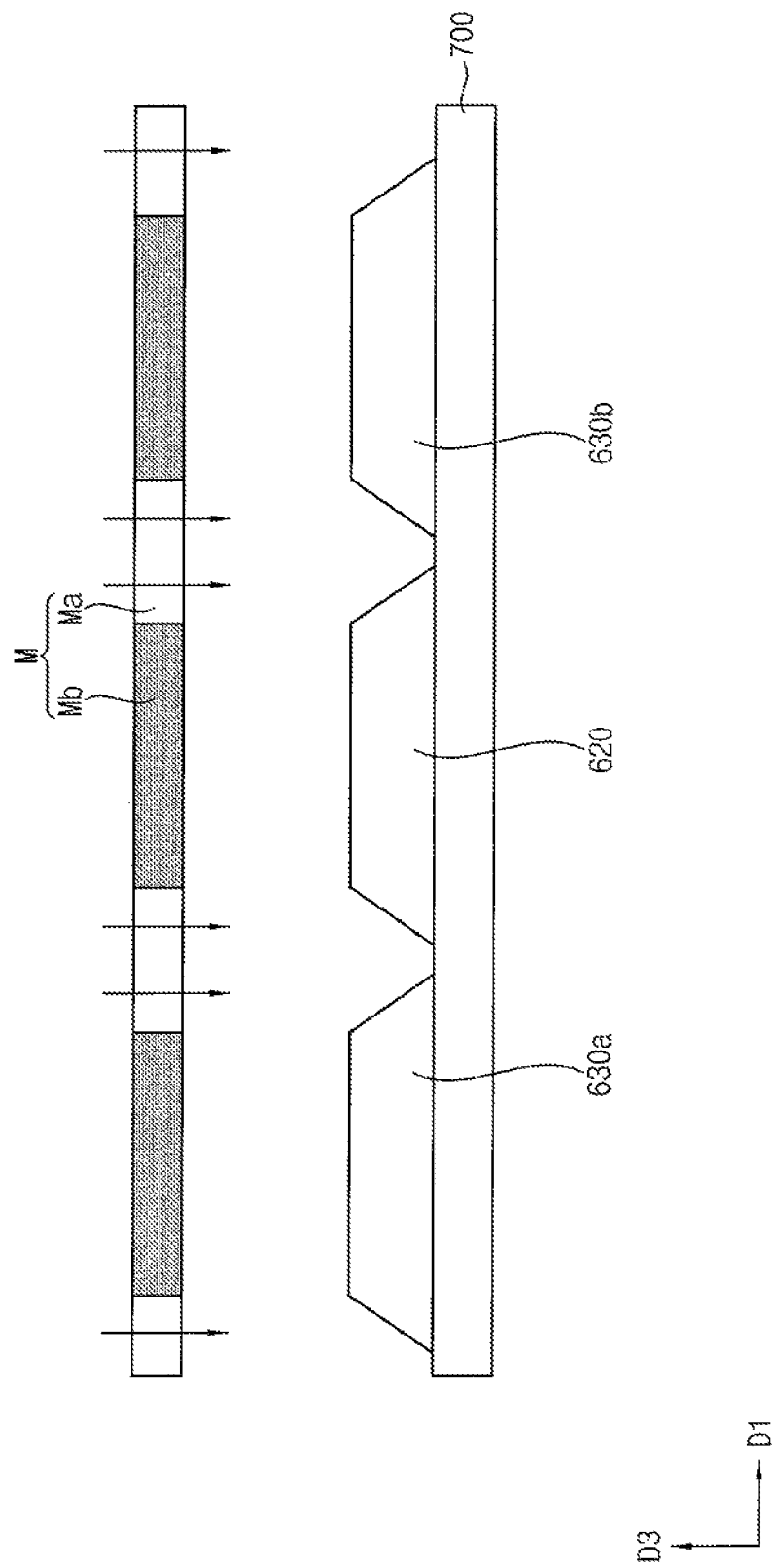

Referring to FIGS. 3, 4, and 8, a high refractive index member 620, a first auxiliary member 630a, and a second auxiliary member 630b may be formed by patterning the high refractive index layer 620'. For example, a mask M may be disposed on the high refractive index layer 620', and the mask M may include a transmission region Ma and a non-transmission region Mb. The transmission region Ma may transmit ultraviolet rays, and the non-transmission region Mb may not transmit the ultraviolet rays. When the high refractive layer 620' includes a positive photoresist material, the mask M may be disposed so that the transmission region Ma overlaps a removal region of the high refractive layer 620'. Accordingly, the high refractive index layer 620' exposed to the ultraviolet rays may be removed. On the other hand, the high refractive index layer 620' not exposed to the ultraviolet rays may remain to form the high refractive index member 620, the first auxiliary member 630a, and the second auxiliary member 630b.

In addition, the high refractive index member 620, the first auxiliary member 630a, and the second auxiliary member 630b may be exposed to high temperatures. Accordingly, the high refractive index member 620, the first auxiliary member 630a, and the second auxiliary member 630b may be cured.

In addition, a plasma treatment process may be performed on the high refractive index member 620, the first auxiliary member 630a, and the second auxiliary member 630b. The plasma treatment process may be performed using an inert gas such as argon ("Ar"), helium ("He"), nitrogen ("N2"), oxygen ("O2"), and carbon tetrafluoride ("CF4"). Outgassing of organic materials included in the high refractive index member 620, the first auxiliary member 630a, and the second auxiliary member 630b may be prevented by the plasma treatment process.

Figure 9:
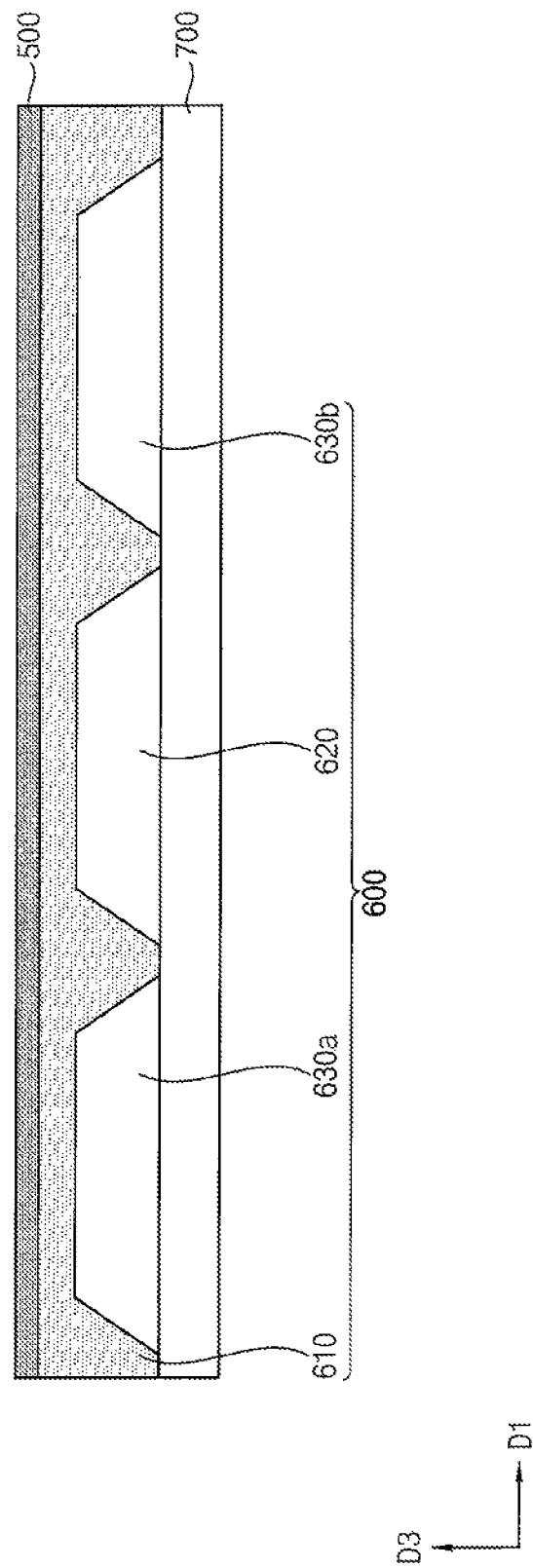

Referring to FIGS. 3, 4, and 9, a low refractive index member 610 may be formed on the high refractive index member 620, the first auxiliary member 630a and the second auxiliary member 630b. Thereafter, a capping member 500 may be formed on the low refractive index member 610. The capping member 500 may be formed to surround the low refractive index member 610.

Figure 10:
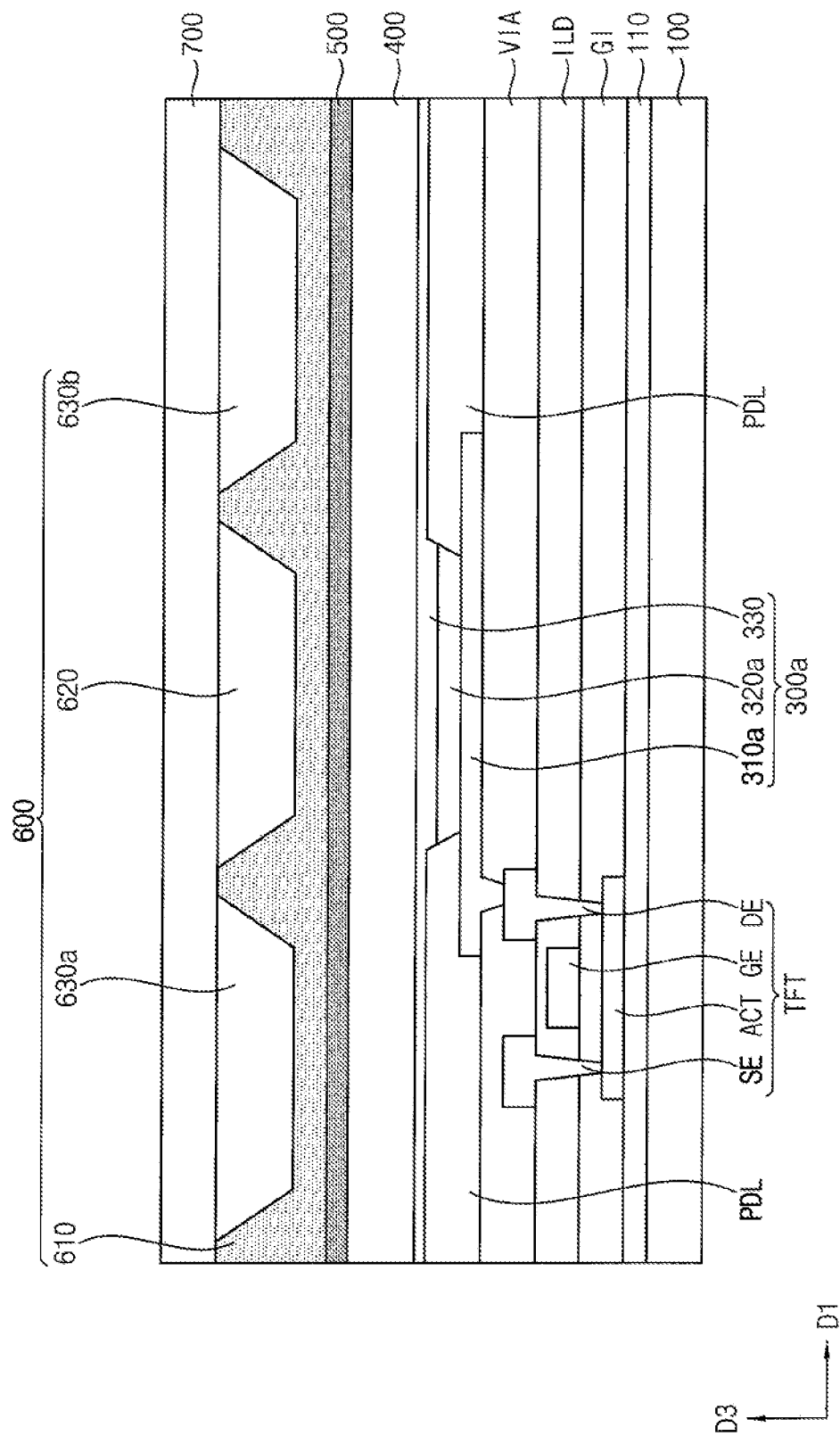

Referring to FIGS. 3, 4 and 10, the second substrate 700 on which the refractive layer 600 and the capping member 500 are formed may be combined with the first substrate 100. For example, the above-described thin film transistor TFT, insulating layers, and emission element layer may be formed on the first substrate 100. As the second substrate 700 and the first substrate 100 are combined with each other, the filling layer 400 may be defined.

Figure 11:
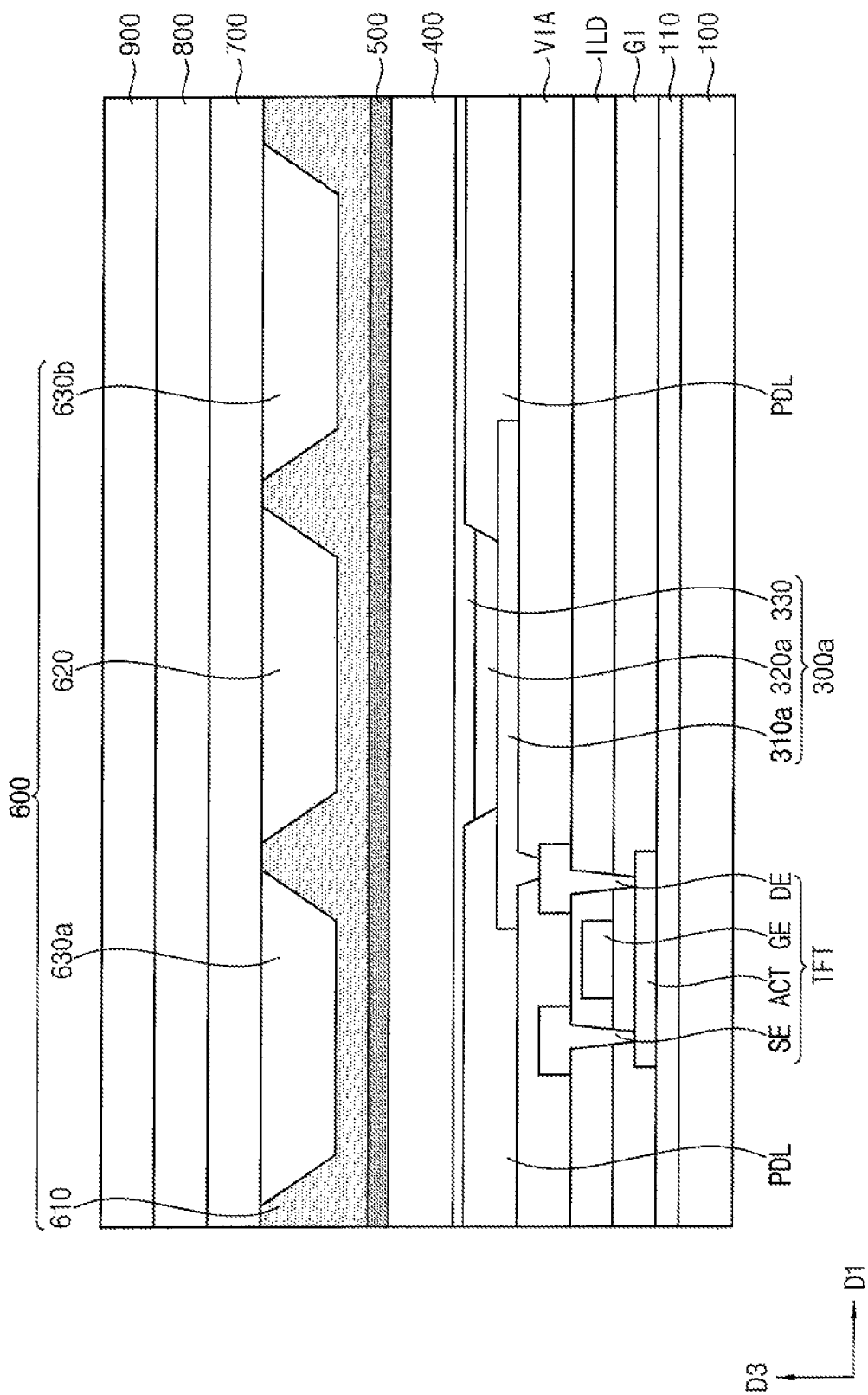

Referring to FIGS. 3, 4, and 11, the above-described functional layer 800 and window 900 may be formed on the second substrate 700. The functional layer 800 may include a polarizing layer, a sensing panel, a planarization layer, and the like, and the window 900 may be formed of glass to protect the display device 10 from external impact.

FIGS. 12 to 15 are cross-section views illustrating a method of manufacturing the display device including the refractive layer of FIG. 6.

Figure 12:
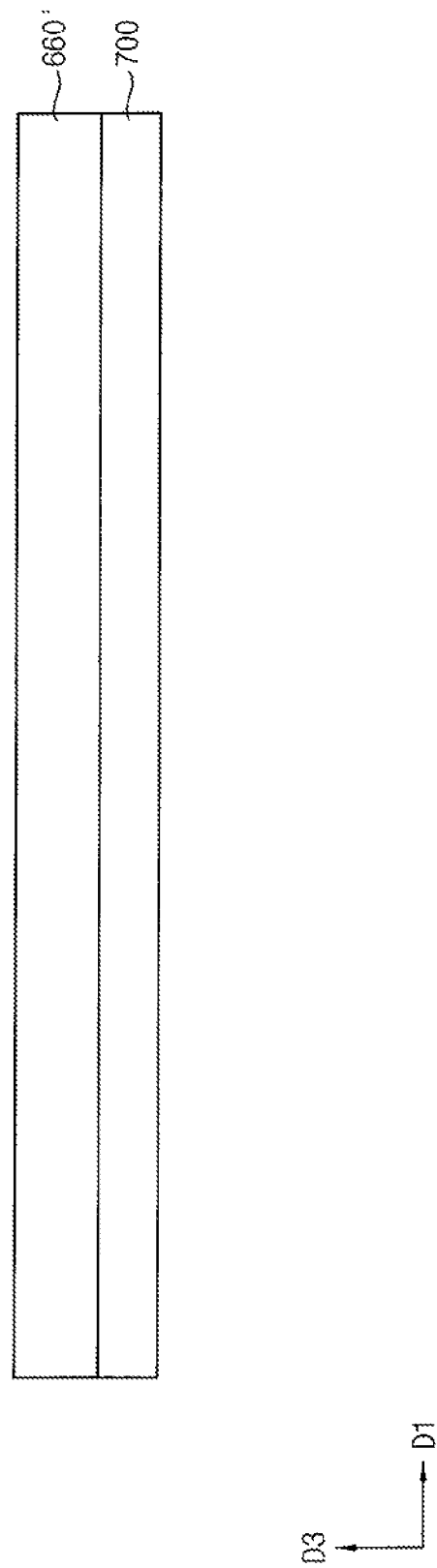
FIGS. 12 to 15 are cross-section views illustrating a method of manufacturing the display device including the refractive layer of FIG. 6.

Referring to FIGS. 3, 6, and 12, a low refractive index layer 660' may be formed on a second substrate 700. In an example embodiment, the low refractive index layer 660' may include a substantially same material as the high refractive index member 620 described with reference to FIG. 4. For example, the low refractive layer 660' may include a siloxane-based resin, a polyimide-based resin, a photoresist, an acrylic resin, a methacryl-based resin, an acrylate-based resin, a methacrylate-based resin, a vinyl-based resin, an epoxy-based resin, a urethane-based resin, a polyamide-based resin, and the like.

Figure 13:
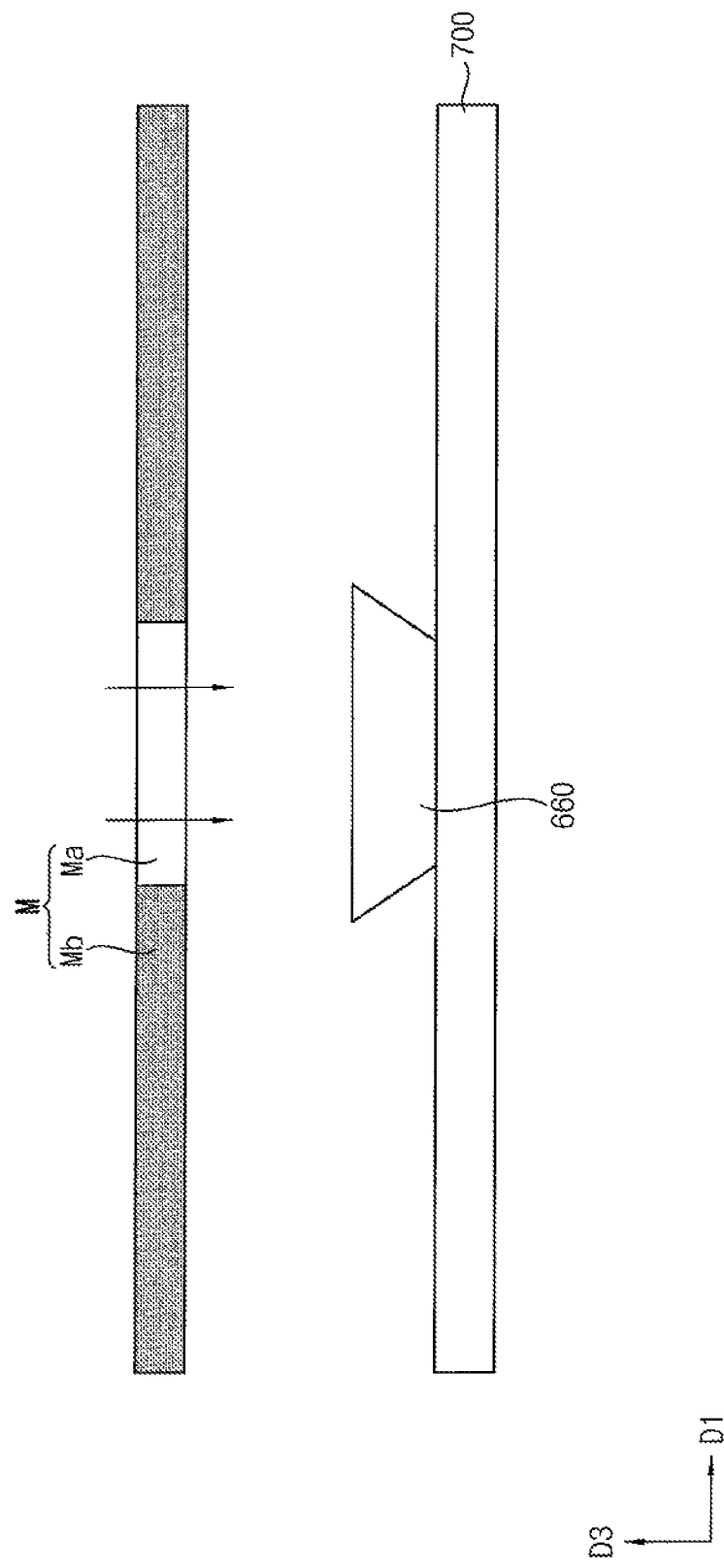

Referring to FIGS. 3, 6, and 13, a low refractive index member 660 may be formed by patterning the low refractive index layer 660'. For example, a mask M may be disposed on the low refractive index layer 660', and the mask M may include a transmission region Ma and a non-transmission region Mb. The transmission region Ma may transmit ultraviolet rays, and the non-transmission region Mb may not transmit the ultraviolet rays. When the low refractive layer 660' includes a negative photoresist material, the mask M may be disposed so that the non-transmission region Mb overlaps a removal region of the low refractive layer 660'. Accordingly, the low refractive index layer 660' not exposed to the ultraviolet rays may be removed. On the other hand, the low refractive index layer 660' not exposed to the ultraviolet rays may remain to form the low refractive index member 660.

Figure 14:
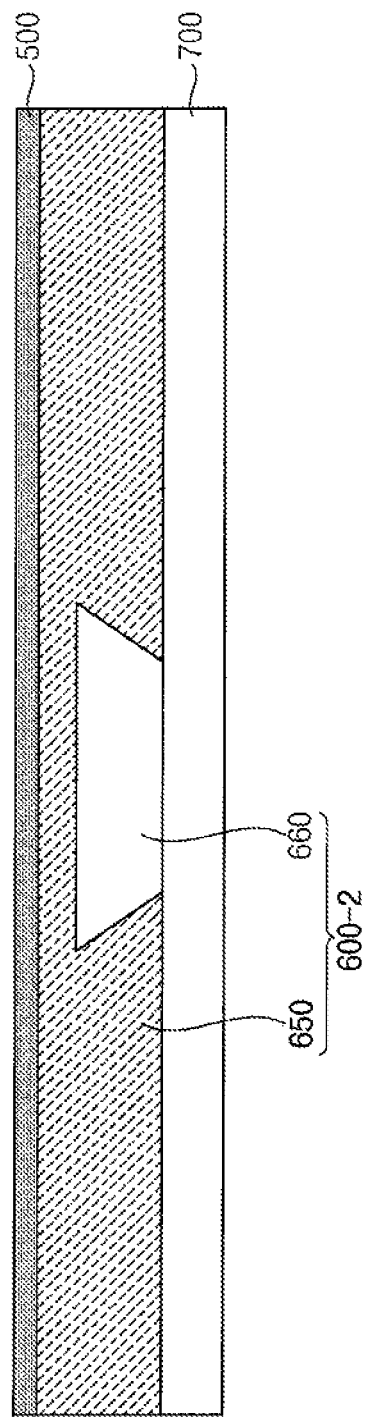

Referring to FIGS. 3, 6, and 14, a high refractive index member 650 may be formed on the low refractive index member 660. In an example embodiment, the high refractive index member 650 may include an organic material having a high refractive index. For example, the high refractive index member 650 may include polyvinyl chloride, polychloro styrene, polydichloro styrene, polyphenylmethyl silane, and polysulfone resin, polystyrene sulfide, phenol formaldehyde resin, etc. Thereafter, a capping member 500 may be formed on the high refractive index member 650. The capping member 500 may be formed to surround the high refractive index member 650.

Figure 15:
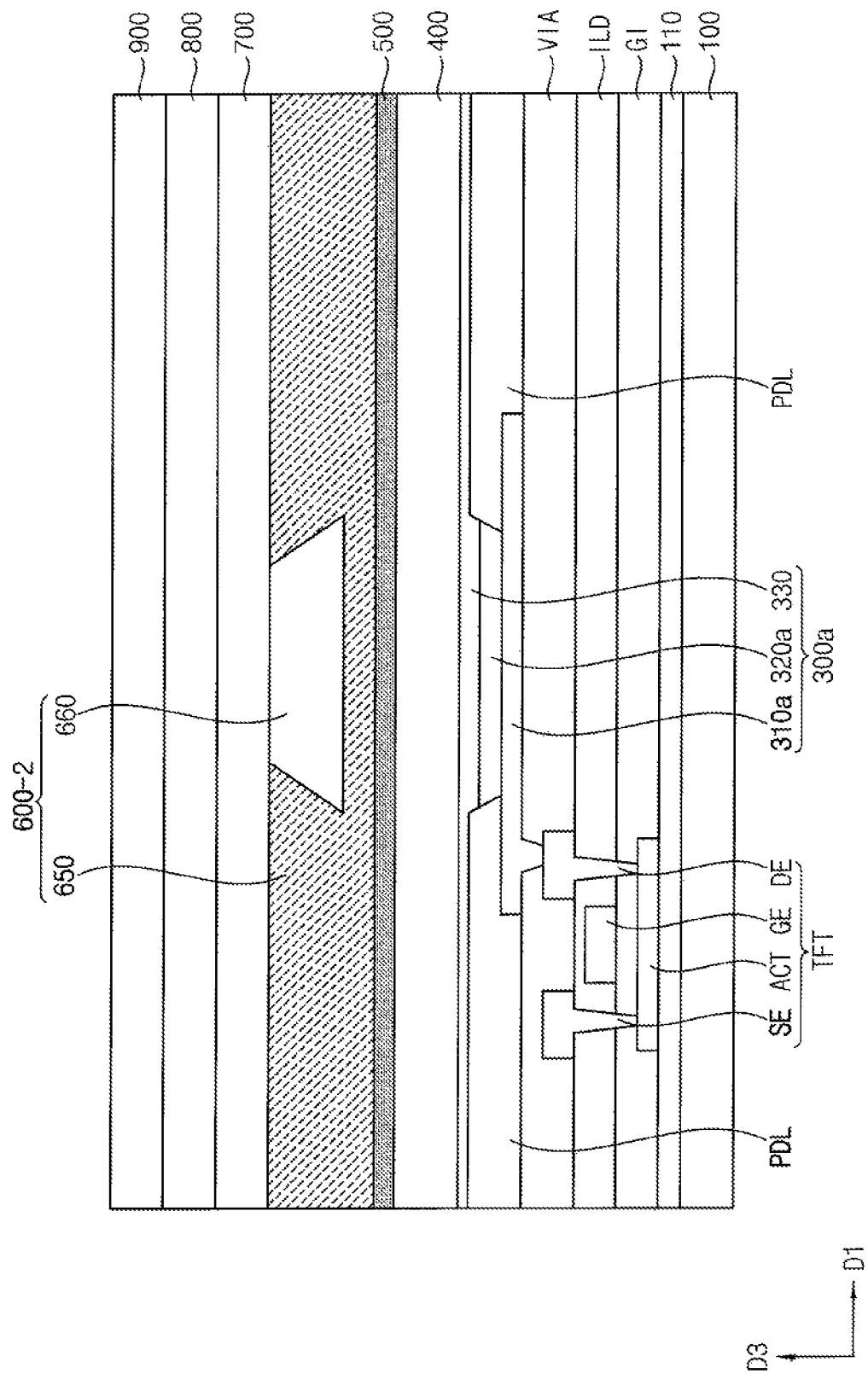

Referring to FIGS. 3, 6, and 15, the second substrate 700 on which the refractive layer 600 and the capping member 500 are formed may be combined with a first substrate 100. For example, the above-described thin film transistor TFT, insulating layers, and emission element layer may be formed on the first substrate 100. As the second substrate 700 and the first substrate 100 are combined with each other, the filling layer 400 may be defined.

Thereafter, the above-described functional layer 800 and window 900 may be formed on the second substrate 700. The functional layer 800 may include a polarizing layer, a sensing panel, a planarization layer, and the like, and the window 900 may be formed of glass to protect the display device 10 from external impact.

Since the display device 10 according to example embodiments includes the refractive layer 600, 600-1, or 600-2 disposed on the emission layer 300, the light L emitted from the emission elements 300a, 300b, and 300c may pass through the second substrate 700 in a vertical direction (e.g., the third direction D3) of the second substrate 700. Therefore, the emission efficiency of the display device 10 may be increased. In addition, the display device 10 includes the low refractive index member 610 and the capping member 500 which are disposed to surround the high refractive index member 620, outgassing of the organic material included in the high refractive index member 620 may be prevented. Accordingly, since the emission elements 300a, 300b, and 300c may not be damaged, a reliability of the display device 10 may be increased.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first substrate;
a first electrode disposed on the first substrate;
an emission layer disposed on the first electrode;
a second electrode disposed on the emission layer;
a high refractive index member disposed on the second electrode, the high refractive index member overlapping the emission layer, and having a first refractive index;
a low refractive index member disposed between the high refractive index member and the emission layer and having a second refractive index smaller than the first refractive index;
a capping member disposed between the low refractive index member and the emission layer; and
a second substrate overlapping at least a portion of the first substrate and disposed on the high refractive index member,
wherein the high refractive index member has a closed shape, and
the low refractive index member and the second substrate entirely cover the closed shape of the high refractive index member.

2. The display device of claim 1, wherein the high refractive index member has a refractive index between 1.5 and 1.6, and
wherein the second substrate has a refractive index between 1.5 and 1.6.

3. The display device of claim 1, wherein the high refractive index member includes a first surface, a second surface, and a side surface,
wherein the first surface contacts the second substrate,
wherein the second surface is opposite to the first surface and has a second length smaller than a first length of the first surface, and wherein the side surface connects the first surface and the second surface.

4. The display device of claim 3, wherein the low refractive index member contacts the second surface and the side surface.

5. The display device of claim 3, wherein the low refractive index member overlaps the emission layer.

6. The display device of claim 3, wherein the emission layer overlaps the second surface and the side surface.

7. The display device of claim 6, wherein a length of the emission layer is smaller than the first length of the first surface and greater than the second length of the second surface.

8. The display device of claim 3, further comprising:
a plurality of auxiliary members disposed on the second electrode and not overlapping the emission layer.

9. The display device of claim 8, wherein the auxiliary members and the high refractive index member have substantially the same shape.

10. The display device of claim 8, wherein the auxiliary members include a same material as the high refractive index member.

11. The display device of claim 8, wherein a size of each of the auxiliary members is smaller than a size of the high refractive index member.

12. The display device of claim 1, wherein the high refractive index member includes an organic material.

13. The display device of claim 12, wherein the high refractive index member includes a siloxane-based resin.

14. The display device of claim 12, wherein the capping member includes an inorganic material.

15. A display device comprising:
a first substrate;
a first electrode disposed on the first substrate;
an emission layer disposed on the first electrode;
a second electrode disposed on the emission layer;
a high refractive index member disposed on the second electrode, overlapping the emission layer, and having a refractive index between 1.5 and 1.6;
a low refractive index member disposed between the high refractive index member and the emission layer and having a refractive index between 1 and 1.4; and
a second substrate overlapping at least a portion of the first substrate, disposed on the high refractive index member, and having a refractive index between 1.5 and 1.6,
wherein the high refractive index member includes a first surface contacting the second substrate, a second surface opposite to the first surface and having a second length smaller than a first length of the first surface, and a side surface connecting the first substrate and the second substrate, and
wherein the side surface has an angle between 60 degrees and 75 degrees with respect to the first surface,
the high refractive index member has a closed shape, and
the low refractive index member and the second substrate entirely cover the closed shape of the high refractive member.

* * * * *